(12) United States Patent
Hedeen et al.

(10) Patent No.: US 11,990,298 B2
(45) Date of Patent: May 21, 2024

(54) MAGNETIC PROXIMITY SENSOR, SECURITY SWITCH, AND METHOD OF DETECTING AN ACTUATOR

(71) Applicant: Magnasphere Corporation, Waukesha, WI (US)

(72) Inventors: Joseph C. Hedeen, Menomonee Falls, WI (US); Ronald Sayles, Vandalia, MI (US); Randall Woods, Mesa, AZ (US)

(73) Assignee: Magnasphere Corporation, Waukesha, WI (US)

( * ) Notice: Subject to any disclaimer, the term of this patent is extended or adjusted under 35 U.S.C. 154(b) by 0 days.

(21) Appl. No.: 17/475,793

(22) Filed: Sep. 15, 2021

(65) Prior Publication Data

US 2022/0084764 A1 Mar. 17, 2022

Related U.S. Application Data

(60) Provisional application No. 63/204,121, filed on Sep. 15, 2020.

(51) Int. Cl.
*H01H 36/00* (2006.01)

(52) U.S. Cl.
CPC ...... *H01H 36/002* (2013.01); *H01H 36/0033* (2013.01); *H01H 36/0073* (2013.01); *H01H 2036/0086* (2013.01)

(58) Field of Classification Search
CPC ............. H01H 36/002; H01H 36/0033; H01H 36/0073; H01H 2036/0086
See application file for complete search history.

(56) References Cited

U.S. PATENT DOCUMENTS

| | | | | |
|---|---|---|---|---|
| 2,793,265 A | * | 5/1957 | Crissinger | H01H 36/008 335/125 |
| 4,213,110 A | * | 7/1980 | Holce | H01H 36/0026 335/207 |
| 5,128,641 A | * | 7/1992 | Posey | H01H 36/002 335/207 |
| 5,332,992 A | | 7/1994 | Woods | |
| 5,668,533 A | * | 9/1997 | Jackson, Jr. | H01H 36/0026 335/205 |
| 5,673,021 A | | 9/1997 | Woods | |
| 5,880,659 A | | 3/1999 | Woods | |
| 5,977,873 A | | 11/1999 | Woods | |
| 6,087,936 A | | 7/2000 | Woods | |
| 6,506,987 B1 | | 1/2003 | Woods | |
| 6,603,378 B1 | | 8/2003 | Collins | |

(Continued)

OTHER PUBLICATIONS

International Search Report and Written Opinion dated Jan. 4, 2022 in corresponding PCT/US2021/050421 filed Sep. 15, 2021, 8 pages.

*Primary Examiner* — Bernard Rojas
(74) *Attorney, Agent, or Firm* — HOVEY WILLIAMS LLP

(57) ABSTRACT

A security switch for detecting an actuator comprises a magnetic field source, a magnetically susceptible object, and a circuit. The magnetic field source is configured to produce a magnetic field gradient. The magnetically susceptible object is suspended at a first position at least in part due to the magnetic field gradient and shiftable to a second position when the actuator affects the magnetic field gradient. The circuit is configured to detect when the object is in the second position.

47 Claims, 7 Drawing Sheets

(56) References Cited

U.S. PATENT DOCUMENTS

| | | |
|---|---|---|
| 7,023,308 B2 | 4/2006 | Woods |
| 7,291,794 B2 | 11/2007 | Woods |
| 7,825,801 B2 | 11/2010 | Woods |
| 7,944,334 B2 | 5/2011 | Woods |
| 8,228,191 B2 | 7/2012 | Woods |
| 8,648,720 B2 | 2/2014 | Woods |
| 8,674,794 B1 | 3/2014 | Oetjen et al. |
| 9,685,289 B1 | 6/2017 | Woods |
| 9,685,290 B1 | 6/2017 | Hedeen |
| 9,704,680 B1 | 7/2017 | Hedeen et al. |
| 10,541,095 B2 | 1/2020 | Woods et al. |
| 2003/0234579 A1 | 12/2003 | Janssen |
| 2005/0110600 A1* | 5/2005 | Woods ............... H01H 36/00 335/205 |
| 2007/0035369 A1* | 2/2007 | Habboosh .......... H01H 36/0046 335/205 |
| 2007/0035370 A1 | 2/2007 | Habboosh |
| 2010/0006408 A1 | 1/2010 | Woods |
| 2012/0194307 A1 | 8/2012 | Woods et al. |

* cited by examiner

MAGNETIC PROXIMITY SENSOR, SECURITY SWITCH, AND METHOD OF DETECTING AN ACTUATOR

RELATED APPLICATIONS

The present application claims priority of U.S. Provisional Patent Application entitled "MAGNETIC PROXIMITY SENSOR," Ser. No. 63/204,121, filed on Sep. 15, 2020, which is hereby incorporated in its entirety by reference herein.

BACKGROUND

Security switches utilize induced magnetic fields in reeds to detect a magnet attached to a door. The magnet emits a magnetic field, and when the magnet is within a threshold distance to a reed, the magnetic field of the magnet polarizes the reed. The polarization of the reed causes a contacting device to close an electrical circuit, which sends a signal indicative of the proximity of the magnet. However, the magnetic field generated by the magnet must be strong enough to sufficiently polarize the reed. Because the strength of the magnetic field decreases over a distance according to the inverse-square law, the distance between the magnet and the reed must be relatively short for the contacting device to close the circuit. This limits the applications for such security switches. Further, it also requires that the door have a magnet thereon.

SUMMARY OF THE INVENTION

The present invention solves the above-described problems and other problems by providing security switches and a method of detecting an actuator that enable sensing from a longer distance.

A proximity sensor constructed in accordance with embodiments of the present invention detects an actuator and comprises a magnetic field source, a magnetically susceptible object, and a circuit. The magnetic field source is configured to produce a magnetic field gradient. The magnetically susceptible object is suspended at a first position at least in part due to the magnetic field gradient and shiftable to a second position when the actuator affects the magnetic field gradient. The circuit is configured to detect when the object is in the second position.

A method of detecting an actuator according to an embodiment of the present invention broadly comprises producing, via a magnetic field source, a magnetic field gradient about a magnetically susceptible object so that the object is at a first position when the actuator is within a threshold distance to the magnetic field source and a second position when the actuator is outside the threshold distance; and detecting a position of the object.

A security switch constructed according to another embodiment of the present invention broadly comprises a magnetic field source, an actuator, a magnetically susceptible object, and a circuit. The magnetic field source produces a magnetic field gradient. The actuator is detached from the magnetic field source and is operable to affect the magnetic field gradient when positioned within a threshold distance to the magnetic field source. The magnetically susceptible object is suspended at a first position at least in part due to the magnetic field gradient and is shiftable to a second position when the actuator is within the threshold distance. The circuit is configured to detect when the object is in the second position.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

BRIEF DESCRIPTION OF THE DRAWING FIGURES

Embodiments of the present invention are described in detail below with reference to the attached drawing figures, wherein.

Figure 1B:
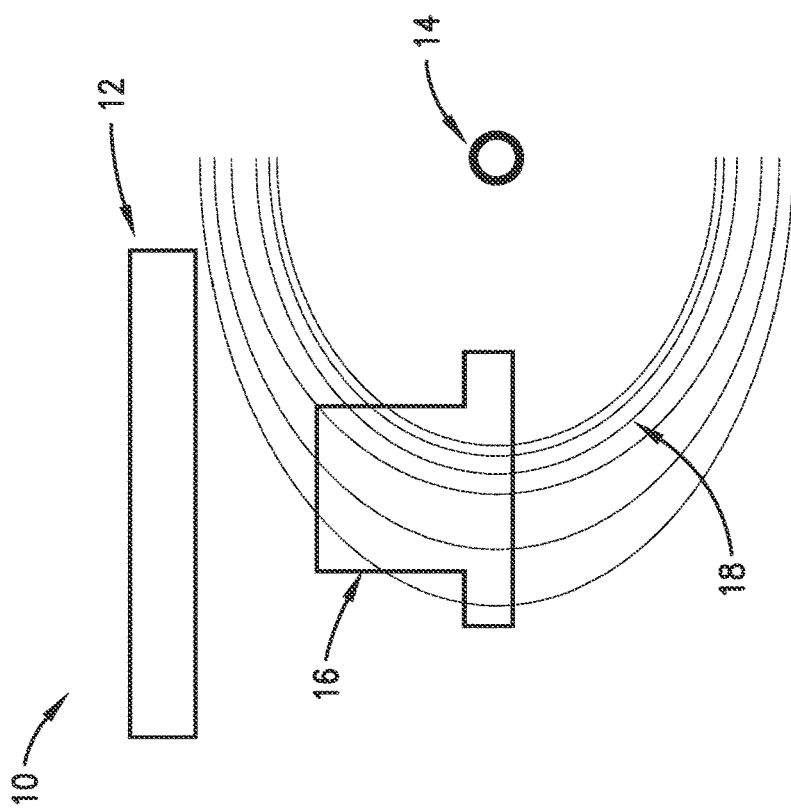
FIG. 1B is a schematic view of the proximity sensor of FIG. 1, with an actuator in proximity to the proximity sensor.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

Figure 1A:
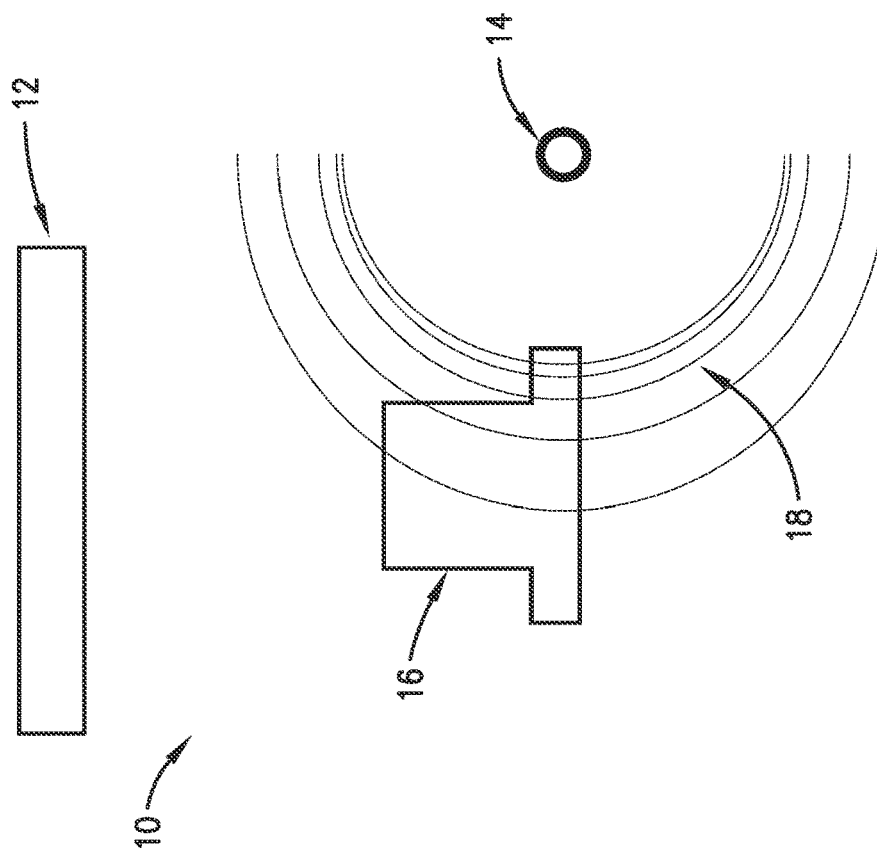
FIG. 1A is a schematic view of a proximity sensor constructed in accordance with embodiments of the present invention.

Turning to FIG. 1A, a proximity sensor 10 constructed in accordance with an embodiment of the invention is schematically illustrated. The proximity sensor 10 is operable to detect the proximity of an actuator 12. The actuator 12 may be a component (such as a machine part, metal door, etc.) made of material operable to affect a magnetic field (such as metal, a paramagnet, a magnet, and/or an electromagnet) and/or a piece of material operable to affect a magnetic field attached to a component that is not made of material operable to affect a magnetic field.

The proximity sensor 10 comprises a magnetic field source 14 and a magnetically susceptible object 16. The magnetic field source 14 is configured to produce a magnetic field gradient 18 about the object 16. The magnetic field source 14 may comprise one or more permanent magnets, electromagnets, ring magnets, or a combination thereof. The magnetic field source 14 may be arranged any number of ways about the object without departing from the scope of the present invention.

The object 16 is configured to detect when the magnetic field gradient 18 is affected by the actuator 12. For example, the object 16 may be part of a ball switch (as discussed in more detail below). Turning to FIG. 1B, as the actuator 12 approaches the magnetic field source 14 and/or the object 16, the magnetic field gradient 18 is affected. The object 16 is configured to be affected by the change in the magnetic field gradient 18, which enables applications for security switches and/or proximity sensors to have farther range and detect different types of actuators.

Figure 2:
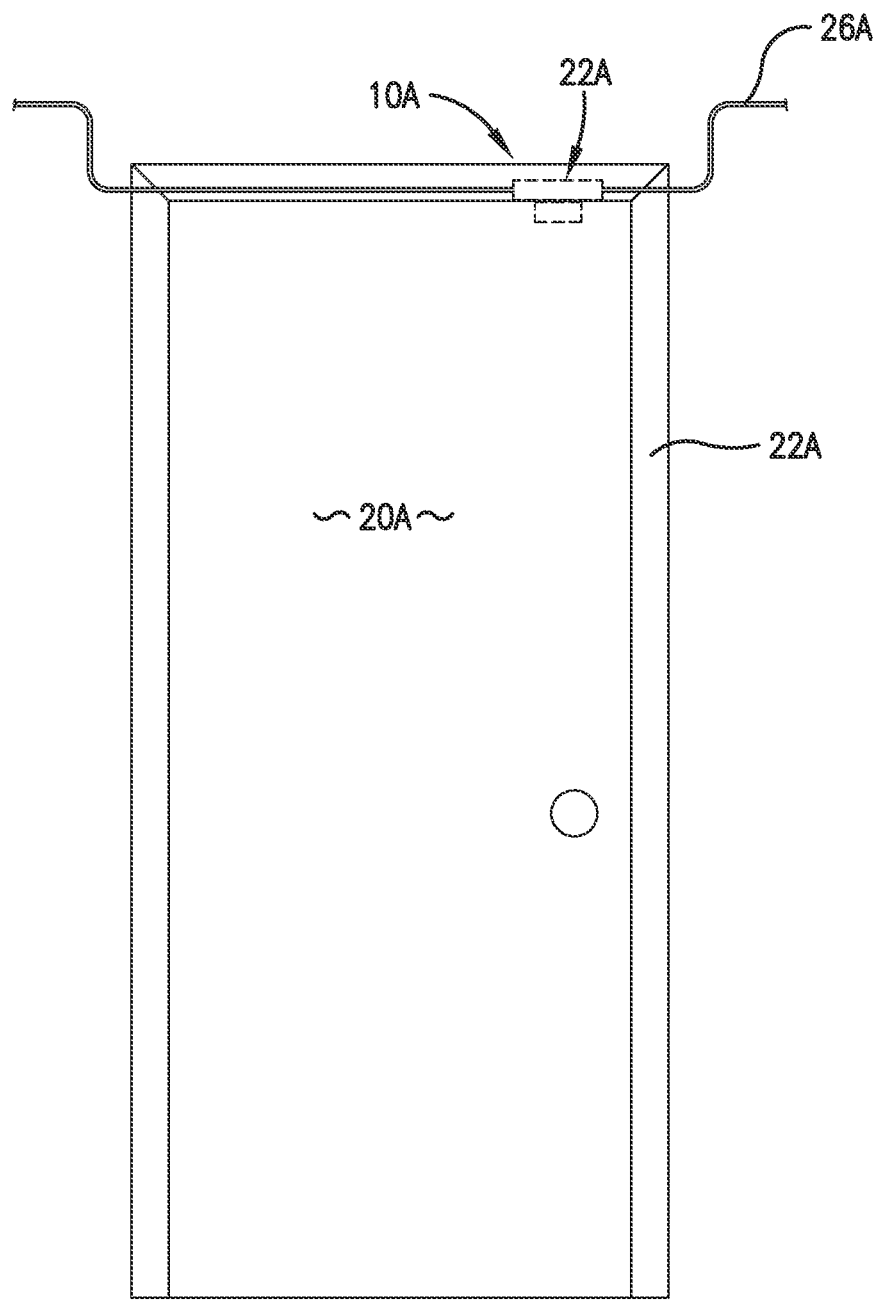
FIG. 2 is a perspective view of a security switch constructed in accordance with another embodiment of the present invention.

Turning to FIG. 2, a proximity sensor 10A constructed in accordance with an embodiment of the invention is shown implemented as a security switch. The proximity sensor 10A may comprise substantially similar components as proximity sensor 10; thus, the components of proximity sensor 10A that correspond to similar components in proximity sensor 10 have an 'A' appended to their reference numerals.

The proximity sensor 10A includes all the features of proximity sensor 10 and is implemented on an exemplary door 20A and door frame 22A. The magnetic field source and the magnetically susceptible object are positioned in a housing 24A and connected to a circuit 26A (as depicted schematically in FIGS. 4-5B). The actuator 12A is positioned on the door 20A. However, the actuator 12A may be positioned on the door frame 22A, and the magnetic field source and the magnetically susceptible object housing 24A may be positioned on the door 20A without departing from the scope of the present invention. The magnetically susceptible object is positioned within the housing 24A so that it shifts when the actuator 12A moves a predetermined distance away from the housing 24A. The predetermined distance may be at least about twelve millimeters, and in some embodiments, the distance may be at least about twenty-five millimeters. The magnetically susceptible object may be arranged within the housing 24A so that the circuit 26A detects the shifting and sends a signal indicative of the door 20A being opened.

Figure 3:
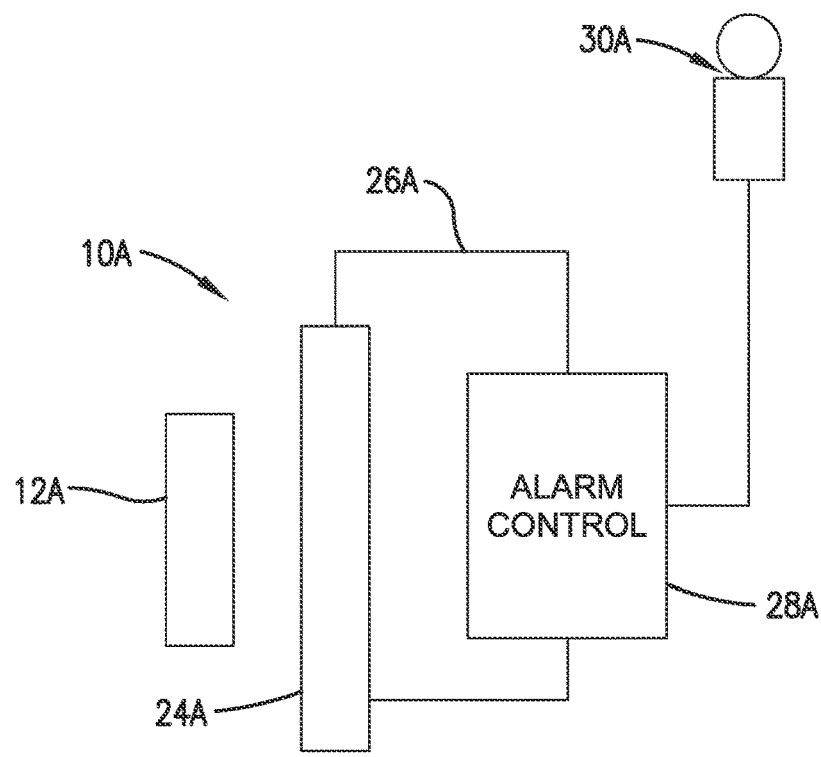
FIG. 3 is a schematic view of a circuit configuration of the security switch of FIG. 2.

Turning to FIG. 3, the circuit 26A connected to the sensor 10A may include control circuitry 28A configured to send a signal representative of an alarm to an external device 30A, such as an audio alarm, visual alarm, computer, smart phone, etc. when the actuator 12 is beyond the threshold distance to the housing 24A. However, the circuit 26A and/or the control circuitry 28A may include reverse logic without departing from the scope of the invention. For example, the circuit 26A may be configured to send the signal when the actuator is within the threshold distance to the housing 24A, and the control circuitry 28A may be configured to send a signal representative of an alarm to the external device 30A when the signal from the circuit 26A is not received. The control circuitry 28A may include processors, microprocessors (single-core and multi-core), microcontrollers, DSPs, field-programmable gate arrays (FPGAs), analog and/or digital application-specific integrated circuits (ASICs), or combinations thereof. The control circuitry 28A may generally execute, process, or run instructions, code, code segments, software, firmware, programs, applications, apps, processes, services, and/or daemons. The control circuitry 28A may also include hardware components such as finite-state machines, sequential and combinational logic, and other electronic circuits that can perform the functions necessary for the operation of the current invention. The control circuitry 28A may be in communication with the other electronic components through serial or parallel links that include address busses, data busses, and/or control lines.

Figure 4:
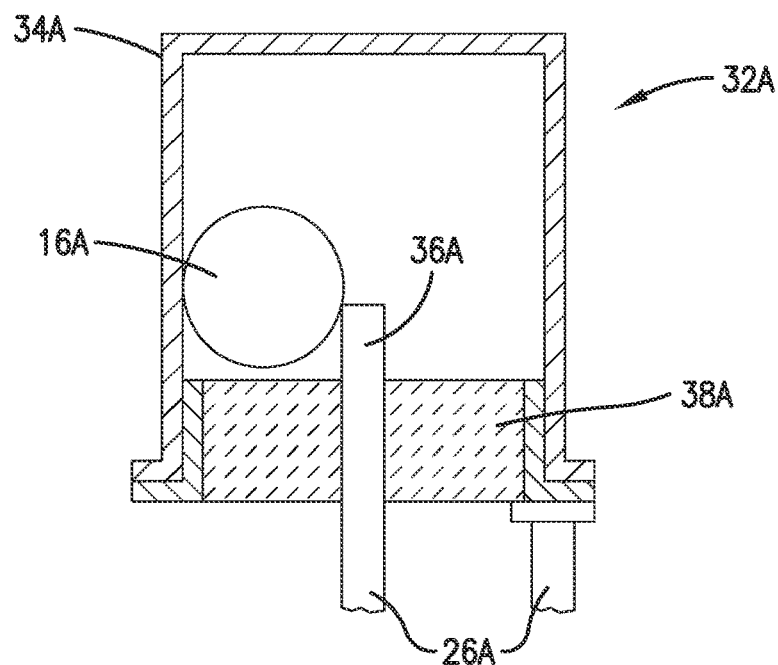
FIG. 4 is a sectional view of a ball switch of the security switch of FIG. 2.

Turning to FIG. 4, the magnetically susceptible object 16A is depicted implemented in an exemplary ball switch 32A. The object 16A is positioned in a switch housing 34A made of conductive material. A conductive contact 36A extends into the housing 34A and is isolated from the housing 34A via insulative material 38A. The conductive contact 36A and the housing 34A may be connected to portions of the circuit 26A. As depicted in FIG. 4, the object 16A is shiftable so that it touches both the contact 36A and the housing 34A in one position, which may close the circuit 26A, thereby indicating the position of the object 16A. However, other means of detecting the position of the object 16A may be used without departing from the scope of the present invention. While the object 16A is depicted as being a ball, it may have any shape without departing from the scope of the present invention.

Figure 5A:
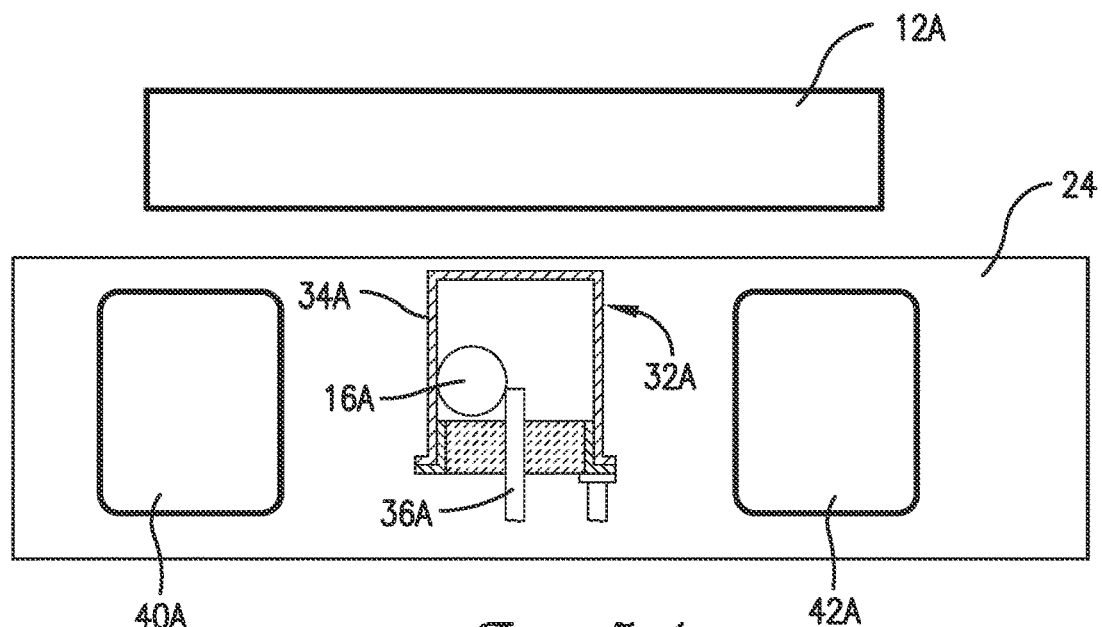
FIG. 5A is a schematic view of the security switch of FIG. 2 showing a magnetic field source configuration.

Turning to FIG. 5A, the magnetically susceptible object 16A is depicted in a first position due to the actuator 12A being within the threshold distance to the housing 24A. In this embodiment, the magnetic field source comprises a pair of magnets 40A, 42A positioned on either side of the switch 32A. As discussed previously, the pair of magnets 40A, 42A may be arranged to generate a magnetic field gradient that is affected by the position of the actuator 12A when the actuator 12A is within the threshold distance. The magnetic field source may include any number of magnets 40A, 42A positioned any number of ways without departing from the scope of the present invention. The threshold distance may be at least about twelve millimeters, and in some embodiments, the distance may be at least about twenty-five millimeters. While in the first position, the object 16A contacts both the contact 36A and the housing 34A.

Figure 5B:
FIG. 5B is a schematic view of the security switch of FIG. 2 with an actuator positioned away from the magnetic field source.

Turning to FIG. 5B, the magnetically susceptible object 16A is shifted to a second position due to the actuator 12A being beyond the threshold distance. When the actuator 12A is beyond the threshold distance, the actuator 12A does not have as substantial of an effect on the magnetic field gradient generated by the magnets 40A, 42A. The magnets 40A, 42A are positioned in the housing 24A so that their gradients suspend the object 16A at the second position when the actuator 12A is beyond the threshold distance. At the second position, the object 16A does not contact both the contact 36A and the housing 34A.

Figure 6:
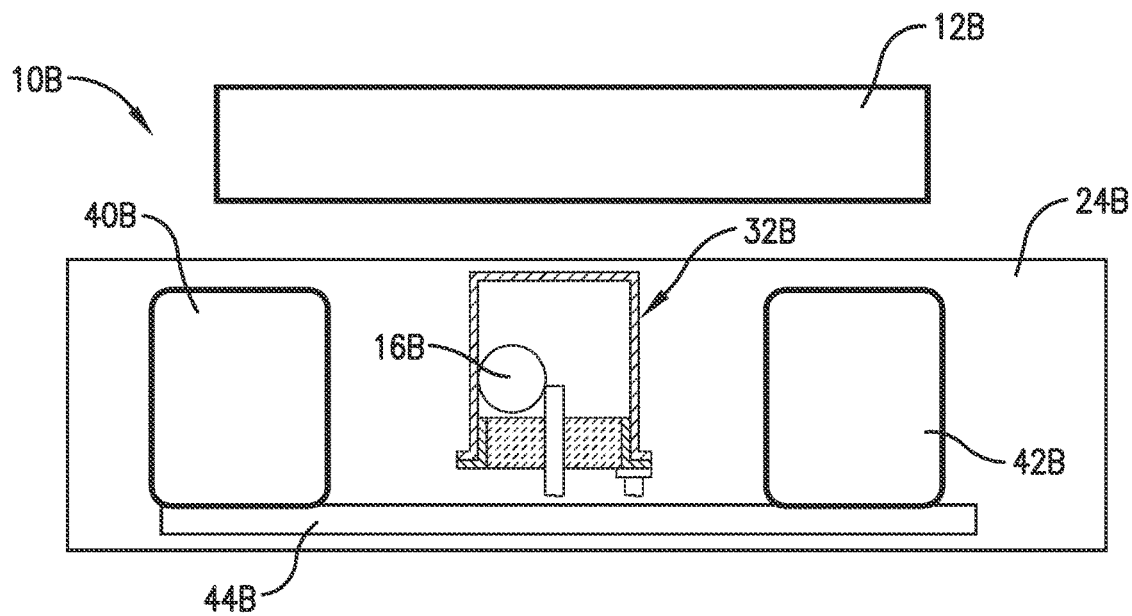
FIG. 6 is a schematic view of a security switch constructed in accordance with another embodiment of the present invention and having a shunt.

A proximity sensor 10B constructed in accordance with another embodiment of the invention is shown in FIG. 6. The proximity sensor 10B may comprise substantially similar components as proximity sensor 10A; thus, the components of proximity sensor 10B that correspond to similar components in proximity sensor 10A have a 'B' appended to their reference numerals.

The proximity sensor 10B includes all the features of proximity sensor 10A, including a ball switch 32B with magnetically susceptible object 16B, housing 24B, actuator 12B, and magnets 40B, 42B, and further includes a shunt 44B extending between the magnets 40B, 42B. The shunt 44B may comprise metal, ferromagnetic material, or other material operable to affect the magnetic field gradient generated by the magnets 40B, 42B. In some embodiments, the shunt 44B comprises a steel plate.

Figure 7:
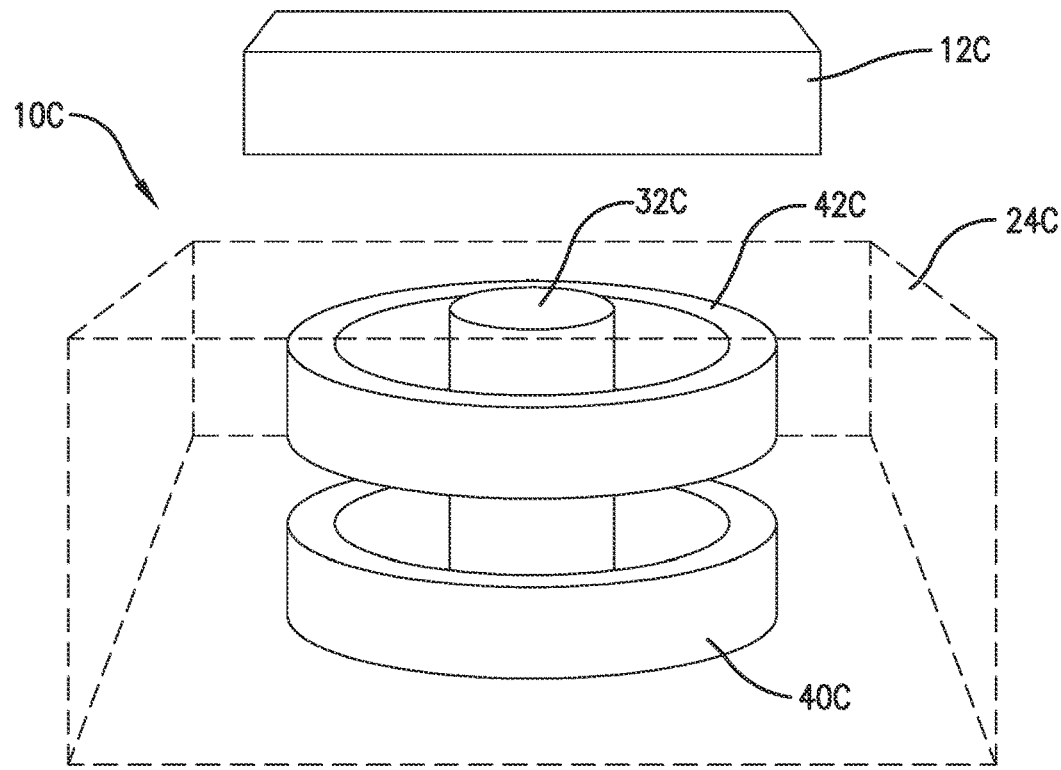
FIG. 7 is a perspective view of a security switch constructed in accordance with another embodiment of the present invention and having ring magnets.

A proximity sensor 10C constructed in accordance with another embodiment of the invention is shown in FIG. 7. The proximity sensor 10C may comprise substantially similar components as proximity sensor 10A, including a ball switch 32C with a magnetically susceptible object, housing 24C, actuator 12C, and magnets 40C, 42C; thus, the components of proximity sensor 10C that correspond to similar components in proximity sensor 10A have a 'C' appended to their reference numerals. The proximity sensor 10C includes all the features of proximity sensor 10A except that the magnets 40C, 42C comprise ring magnets.

Figure 8:
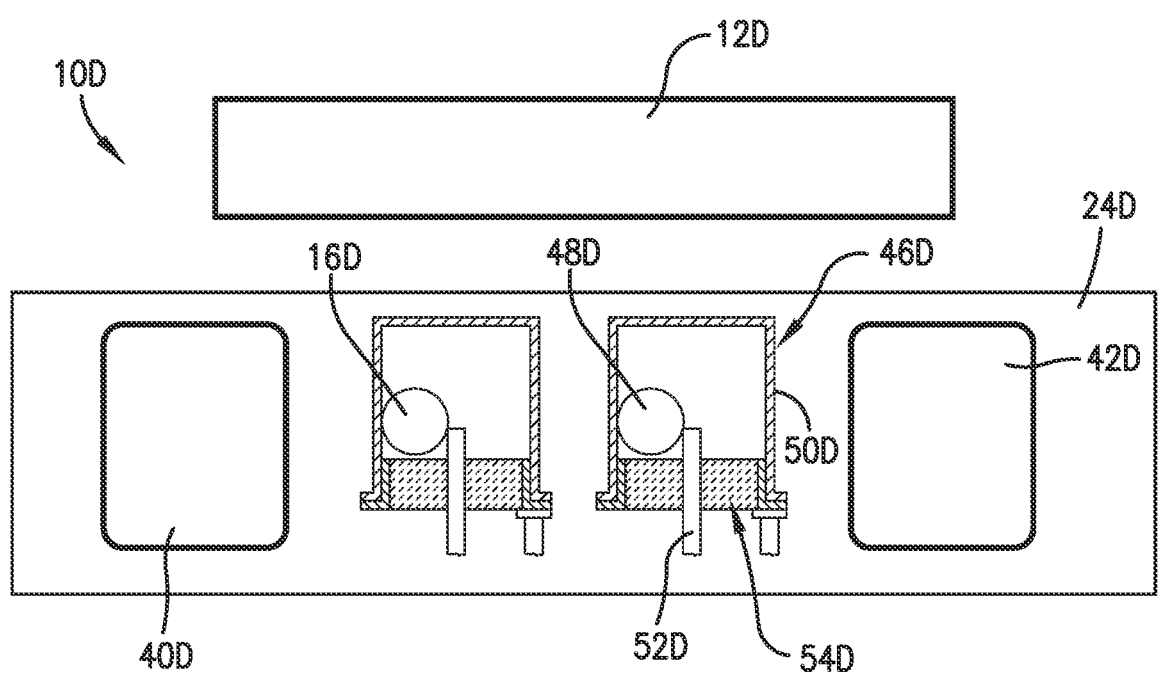
FIG. 8 is a schematic view of a security switch constructed in accordance with another embodiment of the present invention and having a second ball switch.

A proximity sensor 10D constructed in accordance with another embodiment of the invention is shown in FIG. 8. The proximity sensor 10D may comprise substantially similar components as proximity sensor 10A; thus, the components of proximity sensor 10D that correspond to similar components in proximity sensor 10A have a 'D' appended to their reference numerals.

The proximity sensor 10D includes all the features of proximity sensor 10A and further includes a second ball switch 46D comprising a second magnetically susceptible object 48D, conductive housing 50D, conductive contact 52D extending into the housing 50D, and insulative material 54D isolating the contact 52D from the housing 50D. The proximity sensor 10D may be configured so that the magnets 40D, 42D suspend both of the magnetically susceptible objects 16D, 48D at second positions when the actuator 12D is beyond the threshold distance. The second ball switch 46D enables the detection of the position of the actuator 12D along a longitudinal axis of the housing 24D. It also improves the reliability of the sensor 10D.

Figure 9:
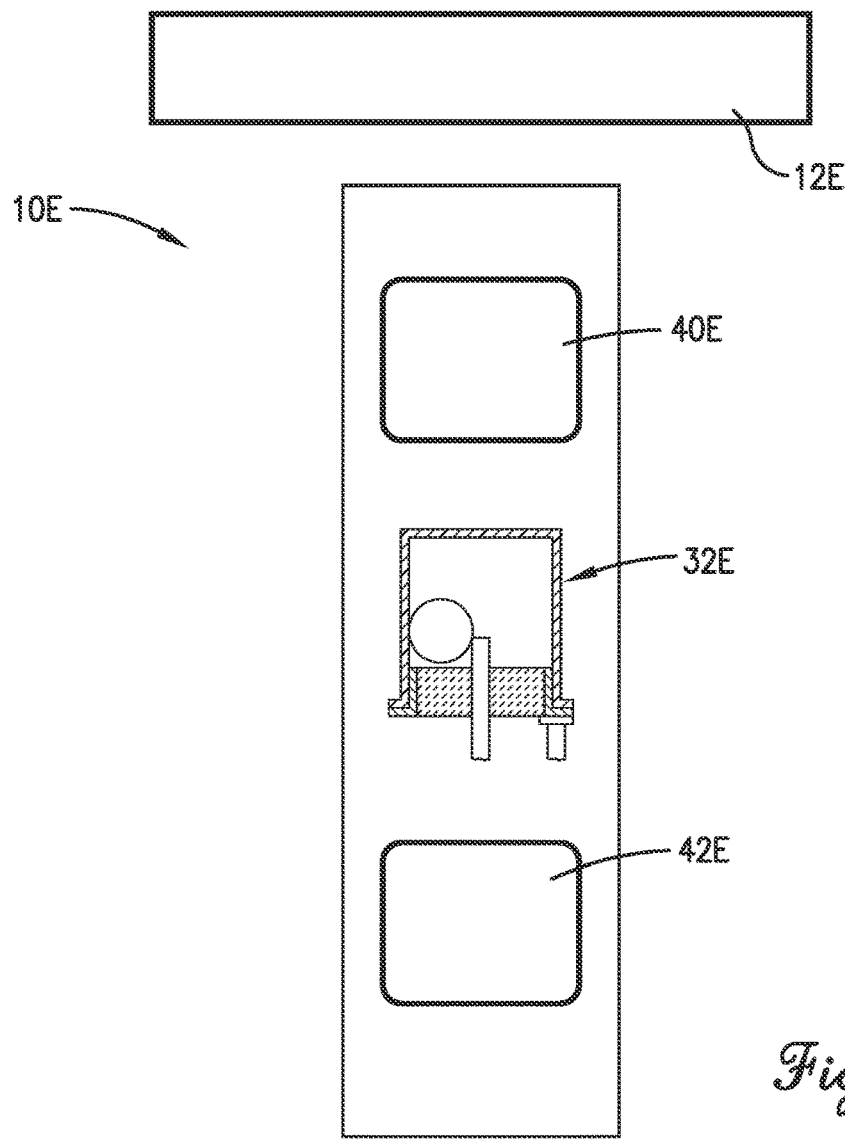
FIG. 9 is a schematic view of a security switch constructed in accordance with another embodiment of the present invention and arranged with a magnet between a ball switch and an actuator.

A proximity sensor 10E constructed in accordance with another embodiment of the invention is shown in FIG. 9. The proximity sensor 10E may comprise substantially similar components as proximity sensor 10A; thus, the components of proximity sensor 10E that correspond to similar components in proximity sensor 10A have an 'E' appended to their reference numerals. The proximity sensor 10E includes all the features of proximity sensor 10A except the magnets 40E, 42E are positioned on either side of the ball switch 32E with one of the magnets 40E being positioned between the switch 32E and the actuator 12E.

Figure 10:
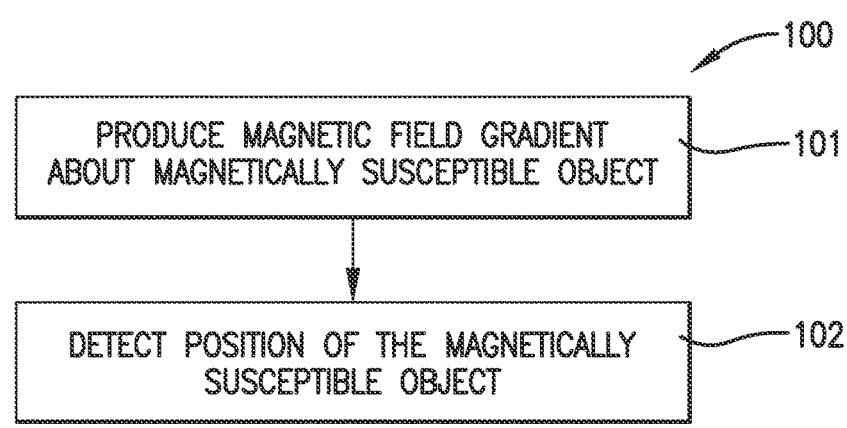
FIG. 10 is a flowchart depicting exemplary steps of a method according to an embodiment of the present invention.

The flow chart of FIG. 10 depicts the steps of an exemplary method 100 of detecting an actuator. In some alternative implementations, the functions noted in the various blocks may occur out of the order depicted in FIG. 10. For example, two blocks shown in succession in FIG. 10 may in fact be executed substantially concurrently, or the blocks may sometimes be executed in the reverse order depending upon the functionality involved. In addition, some steps may be optional.

The method 100 is described below, for ease of reference, as being executed by exemplary devices and components introduced with the embodiments illustrated in FIGS. 1-9. The steps of the method 100 may be performed by the proximity sensor through the utilization of the circuit, the control circuitry, or combinations thereof. However, some of such actions may be distributed differently among such devices or other devices without departing from the spirit of the present invention.

Referring to step 101, a magnetic field gradient is produced about the magnetically susceptible object. The magnetic field gradient is produced via a magnetic field source, such as one or more permanent magnets, electromagnets, ring magnets, and/or a combination thereof. The magnetic field source is positioned so that the gradient it produces suspends the magnetically susceptible object at a first position when the actuator is within a threshold distance to the magnetic field source and a second position when the actuator is outside the threshold distance.

Referring to step 102, the position of the magnetically susceptible object is detected. The position of the magnetically susceptible object may be detected via circuitry. For example, the magnetically susceptible object may be at least partially enclosed in a conductive housing with an electrically isolated contact extending into the housing to form a ball switch. The ball switch may be oriented relative to the magnetic field source so that the ball is touching the contact and the housing when the actuator is within the threshold. Alternatively, the ball switch may be oriented relative to the magnetic field source so that the ball does not touch both the contact and the housing at the same time when the actuator is within the threshold. This circuitry may be configured to detect the position of the object based on whether the object is touching both the housing and the contact, thereby forming a closed electrical path with the circuit.

The method 100 may include additional, less, or alternate steps and/or device(s), including those discussed elsewhere herein. For example, the method 100 may include a step of sending, via the circuit, a signal indicative of the actuator being outside the threshold distance and/or a signal indicative of the actuator being within the threshold distance.

Additional Considerations

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments but is not necessarily included. Thus, the current technology can include a variety of combinations and/or integrations of the embodiments described herein.

Although the present application sets forth a detailed description of numerous different embodiments, it should be understood that the legal scope of the description is defined by the words of the claims set forth in any subsequent regular utility patent application. The detailed description is to be construed as exemplary only and does not describe every possible embodiment since describing every possible embodiment would be impractical. Numerous alternative embodiments may be implemented, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

As used herein, the terms "comprises," "comprising," "includes," "including," "has," "having," or any other variation thereof, are intended to cover a non-exclusive inclusion. For example, a process, method, article, or apparatus that comprise a list of elements is not necessarily limited to only those elements but may include other elements not expressly listed or inherent to such process, method, article, or apparatus.

The patent claims at the end of this patent application are not intended to be construed under 35 U.S.C. § 112(f) unless traditional means-plus-function language is expressly recited, such as "means for" or "step for" language being explicitly recited in the claim (s).

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A proximity sensor for detecting an actuator, the proximity sensor comprising:
    a magnetic field source comprising two or more source permanent magnets positioned relative to one another to produce a magnetic field gradient;
    an object suspended at a first position located at least in part within the magnetic field gradient and shiftable to a second position when the actuator affects the magnetic field gradient; and
    a circuit configured to detect when the object is in the second position,
    wherein the object comprises a permanent magnet.

2. The proximity sensor of claim 1, further comprising a shunt extending between the two or more source permanent magnets.

3. The proximity sensor of claim 2, wherein the shunt comprises a steel plate.

4. The proximity sensor of claim 1, wherein the object is positioned between at least two magnets of the two or more source permanent magnets.

5. The proximity sensor of claim 1, wherein the two or more source permanent magnets and the object are spaced apart along a first axis, and the object is configured to shift to the second position when the object is within a threshold distance to the actuator along a second axis that is orthogonal to the first axis.

6. The proximity sensor of claim 1, wherein the two or more source permanent magnets and the object are spaced apart along a first axis, and the object is configured to shift to the second position when the object is within a threshold distance to the actuator along the first axis.

7. The proximity sensor of claim 1, further comprising an electrically conductive housing that at least partially encloses the object; and
    a contact that is electrically isolated from the housing and that extends into the housing to contact the object at either the first position or the second position.

8. The proximity sensor of claim 1, wherein the object is configured to shift to the second position when the actuator is at least about twelve millimeters away from the object.

9. The proximity sensor of claim 1, wherein the object is configured to shift to the second position when the actuator is at least about twenty-five millimeters away from the object.

10. The proximity sensor of claim 1, wherein the two or more source permanent magnets are ring magnets.

11. The proximity sensor of claim 1, wherein the object is a first object, further comprising a second object suspended at a first position located at least in part within the magnetic field gradient and shiftable to a second position when the actuator affects the magnetic field gradient, wherein the second object comprises a permanent magnet and the circuit is configured to detect when the second object is in the second position.

12. The proximity sensor of claim 1, further comprising a housing that at least partially encloses the object and the magnetic field source and that includes a bottom wall comprising metal.

13. The proximity sensor of claim 1, wherein the object is sphere-shaped.

14. The proximity sensor of claim 1, wherein the object comprises metal.

15. A security switch comprising:
    a magnetic field source comprising two or more source permanent magnets positioned so that the magnetic field source produces a magnetic field gradient;
    an actuator detached from the magnetic field source and operable to affect the magnetic field gradient when positioned within a threshold distance to the magnetic field source;
    an object suspended at a first position located at least in part within the magnetic field gradient and shiftable to a second position when the actuator is within the threshold distance; and
    a circuit configured to detect when the object is in the second position,
    wherein the object comprises a permanent magnet.

16. The security switch of claim 15, further comprising a shunt extending between at least two of the two or more source permanent magnets.

17. The security switch of claim 16, wherein the shunt comprises a steel plate.

18. The security switch of claim 15, wherein the object is positioned between at least two magnets of the two or more source permanent magnets.

19. The security switch of claim 15, wherein the two or more source permanent magnets and the object are spaced apart along a first axis, and the object is configured to shift to the second position when the object is within a threshold distance to the actuator along a second axis that is orthogonal to the first axis.

20. The security switch of claim 15, wherein the two or more source permanent magnets and the object are spaced apart along a first axis, and the object is configured to shift to the second position when the object is within a threshold distance to the actuator along the first axis.

21. The security switch of claim 15, further comprising an electrically conductive housing that at least partially encloses the object; and a contact that is electrically isolated from the housing and that extends into the housing to contact the object at either the first position or the second position.

22. The security switch of claim 15, wherein the object is configured to shift to the second position when the actuator is at least about twelve millimeters away from the object.

23. The security switch of claim 15, wherein the object is configured to shift to the second position when the actuator is at least about twenty-five millimeters away from the object.

24. The security switch of claim 15, wherein the two or more source permanent magnets are ring magnets.

25. The security switch of claim 15, wherein the object is a first object, further comprising a second object suspended at a first position located at least in part within the magnetic field gradient and shiftable to a second position when the actuator is within the threshold distance, wherein the second object comprises a permanent magnet and the circuit is configured to detect when the second object is in the second position.

26. The security switch of claim 15, further comprising a housing that at least partially encloses the object and the magnetic field source and that includes a bottom wall comprising metal.

27. The security switch of claim 15, wherein the object is sphere-shaped.

28. The security switch of claim 15, wherein the object comprises metal.

29. The security switch of claim 15, wherein the actuator comprises metal.

30. The security switch of claim 15, wherein the actuator comprises ferromagnetic material.

31. A method of detecting an actuator, the method comprising:
    producing, via a magnetic field source comprising two or more source permanent magnets, a magnetic field gradient about an object so that the object is at a first position when the actuator is within a threshold distance to the magnetic field source and a second position when the actuator is outside the threshold distance, wherein the object comprises a permanent magnet; and
    detecting a position of the object.

32. The method of claim 31, wherein detecting the position of the object comprises detecting via an electrical circuit.

33. The method of claim 31, wherein the magnetic field source includes a shunt extending between at least two of the two or more source permanent magnets.

34. The method of claim 33, wherein the shunt comprises a steel plate.

35. The method of claim 31, further comprising positioning the object between at least two magnets of the two or more source permanent magnets.

36. The method of claim 31, further comprising positioning the two or more source permanent magnets and the object along a first axis so that the object is configured to shift to the first position when the actuator is within the threshold distance to the object along a second axis that is orthogonal to the first axis.

37. The method of claim 31, further comprising positioning the two or more source permanent magnets and the object along a first axis so that the object is configured to shift to the second position when the actuator is within the threshold distance to the object along the first axis.

38. The method of claim 31, further comprising
    housing the object in an electrically conductive housing; and
    contacting the object, via a contact that is electrically isolated from the housing and that extends into the housing, at either the first position or the second position.

39. The method of claim 31, wherein the threshold distance is at least about twelve millimeters.

40. The method of claim 31, wherein the threshold distance is at least about twenty-five millimeters away from the object.

41. The method of claim 31, wherein the two or more source permanent magnets are ring magnets.

42. The method of claim 31, wherein the object is a first object, further comprising
    producing, via the magnetic field source, the magnetic field gradient about a second object so that the second object is at a first position when the actuator is within the threshold distance to the magnetic field source and a second position when the actuator is outside the threshold distance, wherein the second object comprises a permanent magnet; and
    detecting a position of the second object.

43. The method of claim 31, further comprising enclosing, via a housing, the object and the magnetic field source, wherein the housing includes a bottom wall comprising metal.

44. The method of claim 31, wherein the object is sphere-shaped.

45. The method of claim 31, wherein the object comprises metal.

46. The method of claim 31, wherein the actuator comprises metal.

47. The method of claim 31, wherein the actuator comprises ferromagnetic material.

\* \* \* \* \*